United States Patent
De Vaulx

(10) Patent No.: US 9,385,290 B2
(45) Date of Patent: Jul. 5, 2016

(54) ASSEMBLY COMPRISING A THERMOELECTRIC ELEMENT AND A MEANS FOR ELECTRICALLY CONNECTING SAID THERMOELECTRIC ELEMENT, MODULE AND THERMOELECTRIC DEVICE COMPRISING SUCH AN ASSEMBLY

(71) Applicant: Valeo Systemes Thermiques, Le Mesnil Saint Denis (FR)

(72) Inventor: Cédric De Vaulx, Autouillet (FR)

(73) Assignee: Valeo Systemes Thermiques, Le Mesnil Saint-Denis (FR)

( * ) Notice: Subject to any disclaimer, the term of this patent is extended or adjusted under 35 U.S.C. 154(b) by 0 days.

(21) Appl. No.: 14/653,608

(22) PCT Filed: Dec. 19, 2013

(86) PCT No.: PCT/EP2013/077328
§ 371 (c)(1),
(2) Date: Jun. 18, 2015

(87) PCT Pub. No.: WO2014/096160
PCT Pub. Date: Jun. 26, 2014

(65) Prior Publication Data
US 2015/0357542 A1 Dec. 10, 2015

(30) Foreign Application Priority Data
Dec. 20, 2012 (FR) ...................... 12 62441

(51) Int. Cl.
*H01L 35/04* (2006.01)
*H01L 35/10* (2006.01)
*H01L 35/08* (2006.01)
*H01L 35/32* (2006.01)

(52) U.S. Cl.
CPC ............... *H01L 35/10* (2013.01); *H01L 35/08* (2013.01); *H01L 35/32* (2013.01)

(58) Field of Classification Search
CPC ...................................... H01L 35/10
USPC ......................................................... 136/200
See application file for complete search history.

(56) References Cited

U.S. PATENT DOCUMENTS

| 2005/0002818 A1* | 1/2005 | Ichikawa et al. ......... B22F 7/02 419/6 |
| 2011/0114149 A1* | 5/2011 | Li ........................... H02S 40/34 136/244 |
| 2012/0160293 A1* | 6/2012 | Jinushi et al. ........... H01L 35/34 136/237 |

FOREIGN PATENT DOCUMENTS

| EP | 1 721 880 A1 | 11/2006 |
| EP | 1721880 | * 11/2006 |
| WO | 2011/102498 A2 | 8/2011 |

OTHER PUBLICATIONS

International Search Report issued in PCT/EP2013/077328 mailed on Apr. 8, 2014 (2 pages).

*Primary Examiner* — Jayne Mershon
(74) *Attorney, Agent, or Firm* — Osha Liang LLP

(57) ABSTRACT

An assembly of at least one thermoelectric element capable of generating an electric current under the effect of a temperature gradient exerted between two of its sides, referred to as the contact sides, and an electrical connection means is disclosed. The assembly includes a first deformable element electrically connecting the electrical connection means to the thermoelectric element, the first element including a first side linked to the electrical connection means and a second side linked to the thermoelectric element, the first side being deformable independently from the second side and vice versa, the assembly including a second deformable element forming a heat bridge between the first and second sides of the first element. A thermoelectric module including such an assembly and a thermoelectric device including such a module are also disclosed.

12 Claims, 3 Drawing Sheets

ASSEMBLY COMPRISING A THERMOELECTRIC ELEMENT AND A MEANS FOR ELECTRICALLY CONNECTING SAID THERMOELECTRIC ELEMENT, MODULE AND THERMOELECTRIC DEVICE COMPRISING SUCH AN ASSEMBLY

The present invention relates to an assembly including a thermoelectric element and a means for the electrical connection of said thermoelectric element. It also relates to a thermoelectric module, notably intended to generate an electric current in a motor vehicle, including said assembly and a thermoelectric device including said module.

Thermoelectric modules have hitherto been proposed which use elements, referred to as thermoelectric elements, allowing an electric current to be generated in the presence of a temperature gradient between two of their opposite sides, referred to as the first and second contact sides, according to the phenomenon known by the name of the Seebeck effect. These devices include a stack of first tubes, intended for the flow of exhaust gases of an engine, and second tubes, intended for the flow of a heat transfer fluid of a cooling circuit. The thermoelectric elements are sandwiched between the tubes in such a way as to be subjected to a temperature gradient originating from the temperature difference between the exhaust gases, which are hot, and the cooling fluid, which is cold.

The thermoelectric elements are arranged in pairs. The thermoelectric elements belonging to the same pair are electrically interconnected via electrical paths disposed on their first or on their second contact sides.

It is known to assemble the thermoelectric elements on the electrical paths by means of a soldering procedure. During this procedure, the electrical paths and the metal thermoelectric elements are made to expand under the effect of the temperature before the positive connection is established. Once the electrical paths have reached the correct temperature, the positive connection is established and the assembly is cooled.

One disadvantage comes from the fact that the electrical paths and thermoelectric elements do not have the same thermal expansion coefficient. The electrical paths thus contract more than the thermoelectric elements during cooling, which risks damaging the thermoelectric elements, notably by creating cracks and/or breaks in their contact surfaces.

This risk also exists when the thermoelectric module in operation is subjected to a substantial temperature difference between its cold side and its hot side, which is typically the case when the hot side of the device is subjected to temperatures above 250° C. On reaching these temperatures, the electrical paths positively connected to the thermoelectric element on the hot side expand more than those positively connected to the thermoelectric elements on the cold side, which risks damaging the thermoelectric elements in the same way as described above.

The invention aims to improve the situation.

The invention thus proposes an assembly of at least one thermoelectric element capable of generating an electric current under the effect of a temperature gradient exerted between two of its sides, referred to as the contact sides, and electrical connection means, notably intended to electrically connect said thermoelectric element to another thermoelectric element.

According to the invention, said assembly furthermore includes a first deformable element electrically connecting the electrical connection means to the thermoelectric element, said first element including a first side linked to the electrical connection element and a second side linked to the thermoelectric element, said first side being deformable independently from said second side and vice versa, the assembly including a second deformable element implementing a heat bridge between the first and second sides of the first element.

By means of the invention, when the assembly is subjected to substantial temperature variations, the first and second deformable elements can follow, on the one hand, the deformation of the connection means and, on the other hand, the deformation of the thermoelectric element. When the electrical connection means and the thermoelectric element contract and expand differently, the deformable link means then absorbs these variations.

By making the deformation of the first side independent from that of the second side and vice versa, the contraction and expansion of the electrical connection means are mechanically decoupled from those of the thermoelectric element. The risk of breaks or cracks between the electrical connection means and the thermoelectric element is thus limited.

The first and second sides of the first element are advantageously interconnected via two lateral walls in such a way that the first element forms a tube, notably with flat sides. The lateral sides can be deformed to follow, on the one hand, the deformations of the first side of the first element and, on the other hand, the deformations of the second side of the first element.

According to one embodiment of the invention, the first element is a grid. The grid can be deformed locally to absorb the differential expansion forces between the connection means and the thermoelectric element. The first element may also be a sheet of material.

The grid advantageously has a thickness of between 50 and 300 μm.

According to one aspect of the invention, the first element is made of metal, advantageously aluminum.

According to one aspect of the invention, the second element is plastically and/or elastically deformable.

The second element advantageously fills a volume delimited by the first side, the second side and the lateral sides of the first element. The second element is thus deformed with the first side of the first element in a certain way in order to follow the deformation of the connection means and with the second side of the first element in a different way in order to follow the deformation of the thermoelectric element. In the case of a tube, it is adapted to the shape assumed by the tube.

According to one aspect of the invention, the second element is made of a non-solderable material.

According to one aspect of the invention, the second element is made of graphite. The second element is advantageously a sheet of graphite with a thickness of less than 1 mm.

According to one aspect of the invention, said first deformable element is soldered to said thermoelectric element and/or to said electrical connection means.

According to one aspect of the invention, the assembly includes a second thermoelectric element, having two contact sides, said second side of said first element also being linked to said second thermoelectric element.

The invention also relates to a thermoelectric module including a plurality of assemblies as described above.

The invention also relates to a thermoelectric device, notably intended to generate an electric current in a motor vehicle, including at least one module as described above.

The attached figures will clearly explain how the invention can be implemented. In these figures, identical references denote similar elements.

Figure 1:
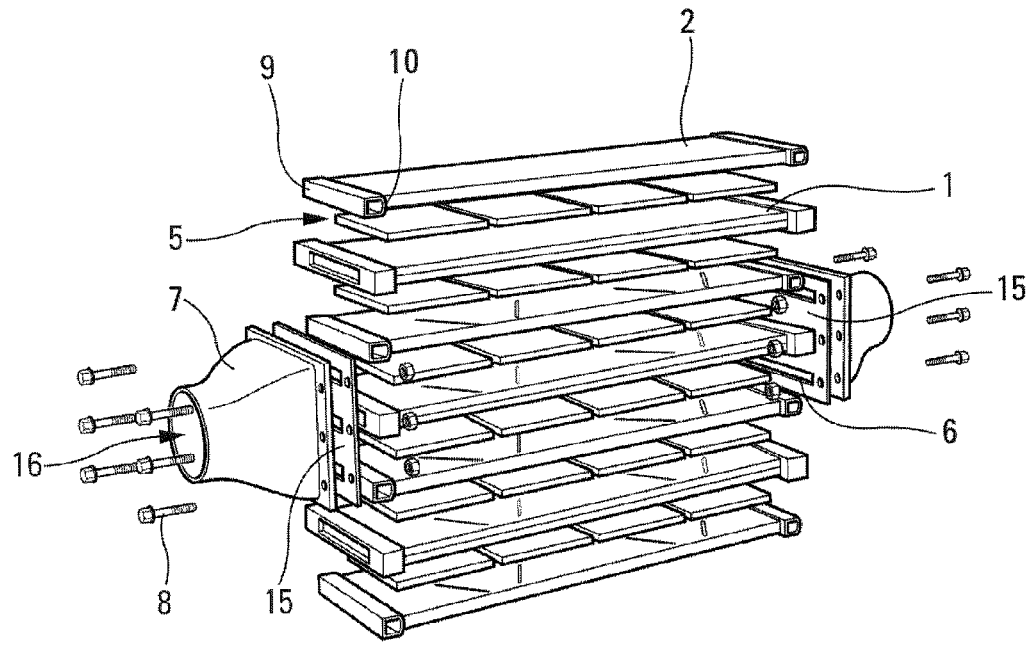
FIG. 1 shows a perspective view of an example of a thermoelectric device according to the invention, shown in an exploded view.

As shown in FIG. 1, a device according to the invention includes thermal conduction means in contact with a hot or cold source such as a plurality of flow tubes 1 of a first fluid alternating with a plurality of flow tubes 2 of a second fluid. Said tubes 1, 2 extend here parallel to one another in the same direction.

The flow tubes 1 of the first fluid are configured, for example, for the flow of a fluid, referred to as a hot fluid. This may involve exhaust gases of a motor vehicle combustion engine. The flow tubes 1 of the first fluid define one or more flow channels of the first fluid, referred to as hot channels. The flow tubes 2 of the second fluid are configured, for example, for the flow of a fluid, referred to as a cold fluid, having a temperature lower than the temperature of the first fluid. This may involve a cooling liquid, such as a mixture of water and glycol, originating, for example, from a low-temperature cooling loop of the vehicle. The flow tubes 2 of the second fluid define one or more flow channels of the first fluid, referred to as cold channels.

Here, there are three exhaust gas flow tubes 1 are five cooling liquid flow tubes 2.

Said device furthermore includes a plurality of elements, referred to as thermoelectric elements, capable of creating an electric current from a temperature gradient applied between two of their sides, referred to as the first and second contact sides, provided in a heat exchange relationship with said hot and cold channels.

This involves, for example, more or less parallelepiped-shaped elements 4 (shown schematically in FIGS. 2, 3 and 4) generating an electric current, according to the Seebeck effect. According to other embodiments that are not shown, the shape of the elements 4 is different, such as cylindrical. Such elements allow the creation of an electric current in a charge connected between said contact sides 3a, 3b,disposed opposite one another. In a manner known to the person skilled in the art, such elements are made, for example, from manganese silicide (MnSi).

Said flow tubes 1, 2 have, for example, a flattened section according to a direction of elongation, orthogonal to the direction of expansion of the tubes. Said flow tubes 1, 2 may thus be flat tubes. This means that they have two large parallel sides connected by small sides. The thermoelectric elements 4 are in contact with one and/or the other of the flat sides of the tubes 1, 2 via their contact sides 3a,3b.

Said tubes 2 intended for the flow of the cold fluid are made, for example, from aluminum and/or aluminum alloy. The tubes 1 intended for the flow of the hot fluid are made, notably, from stainless steel. They are formed, for example, by profiling, welding and/or soldering.

Said device furthermore includes, for example, a collector plate 15 at each of the ends of said flow tubes 1 of the first fluid. Said collector plate 15 is provided with orifices 6 into which the ends of said flow tubes 1 of the first fluid are inserted.

Said device may also include collector boxes 7 in fluid communication with the end of said flow tubes 1 of the first fluid and fixed to the collector plates 15 by means of screws 8. Said boxes include an aperture 16 for the input and output of the first fluid.

Said flow tubes 2 of the second fluid may be provided on each of their ends with collectors 9 allowing communication of said flow tubes 2 of the second fluid and with a collector box, not shown, of the second fluid via apertures 10 opening out onto a lateral side of the group defined by the stack of the flow tubes 1, 2 of the first and second fluid.

As shown in FIG. 1, the thermoelectric elements are distributed in layers 5 provided between the flow tubes 1 of the first fluid and the flow tubes 2 of the second fluid. Each layer 5 represents schematically a plurality of thermoelectric elements disposed here in a rectangular shape. In the thermoelectric device, electrical links are established between the layers 5 of thermoelectric elements. An electrical connector, not shown, allows the device to be connected to an external electric circuit.

Here, said thermoelectric device includes a plurality of electric modules, each of the electric modules being formed from at least one of said cold channels and one of said hot channels and from a plurality of said thermoelectric elements 4 located between said cold channel and said hot channel.

The thermoelectric elements 4 may, for a first part, be elements of a first type, referred to as P (denoted 4P in FIG. 2) allowing an electrical potential difference to be established in one direction, referred to as positive, when they are subjected to a given temperature gradient, and, for the other part, elements of a second type, referred to as N (denoted 4N in FIG. 2) allowing the creation of an electrical potential difference in an opposite direction, referred to as negative, when they are subjected to the same temperature gradient.

The thermoelectric elements applied to the same tube 1, 2 are electrically connected.

Figure 2:
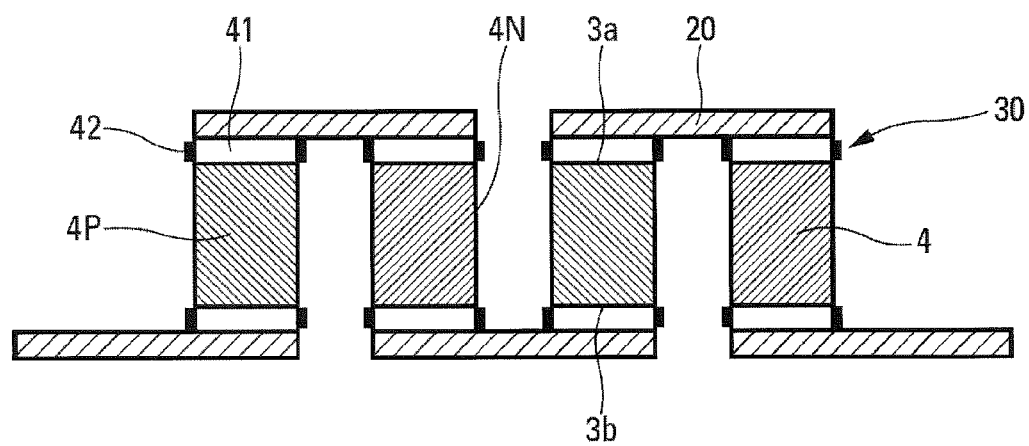
FIG. 2 is a schematic side view of a part of a thermoelectric module including a plurality of assemblies according to the invention in which each electrical connection means is connected to the two thermoelectric elements via two independent first elements.
Figure 3:
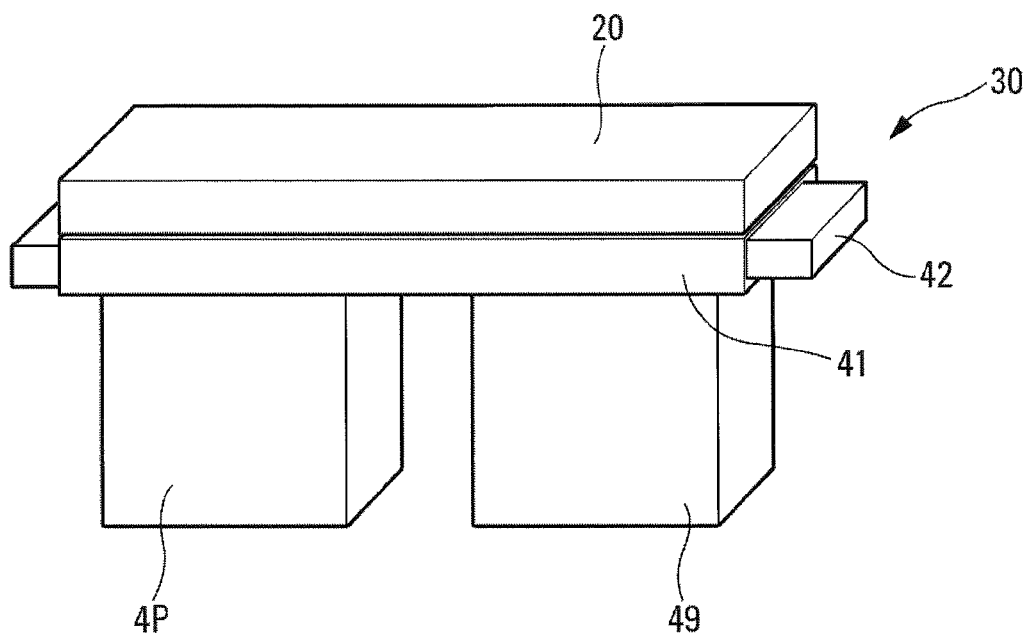
FIG. 3 is a schematic view of a part of a thermoelectric module including two thermoelectric elements and an electrical connection means which is connected to the two thermoelectric elements via a single first element.
Figure 4:
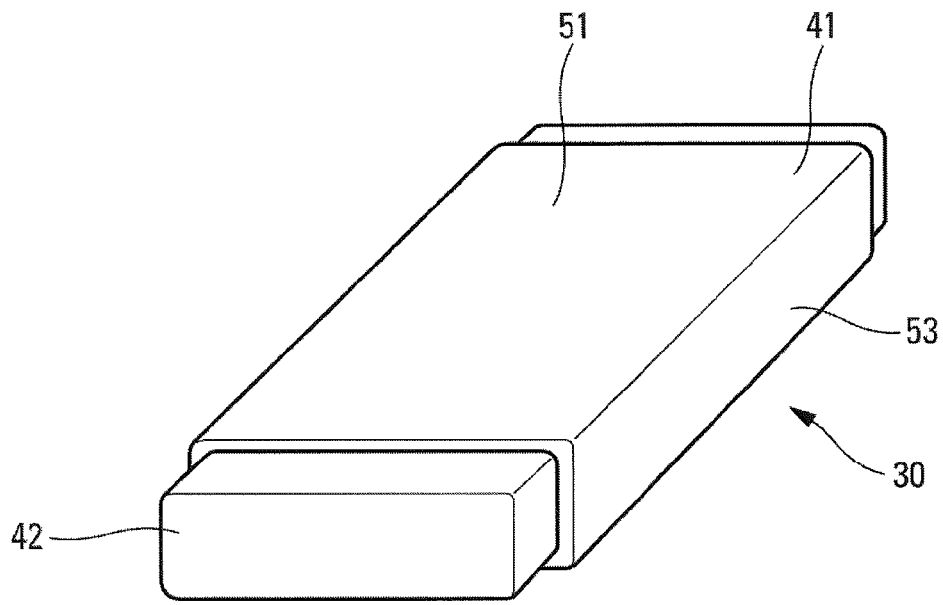
FIG. 4 is a perspective view showing a deformable link means of the assembly according to the invention.

In particular, and as shown in FIGS. 2 and 3, the P-type thermoelectric elements and the N-type thermoelectric elements, provided between the same flow tube of the first fluid and the same flow tube of the second fluid, may be associated with one another in such a way as to allow the flow of the current in series from one element of the first type to an element of the second type. It is also possible to interconnect the sides of thermoelectric elements of the same type via electrical paths for a parallel assembly of said elements. The thermoelectric elements 4 associated in this way form a base conduction cell and the cells obtained may be associated in series and/or in parallel.

In these figures, the first contact side 3a of each thermoelectric element is intended to be in a heat exchange relationship with the hot channel and the second contact side 3b of each thermoelectric element is intended to be in a heat exchange relationship with the cold channel.

The P-type thermoelectric elements alternate with the N-type thermoelectric elements. These two types of thermoelectric elements may have different coefficients of expansion. They are arranged in pairs, each pair being formed from one P-type thermoelectric elements and one N-type thermoelectric element. The module is configured here to allow a current flow between the first contact sides 3a of the thermoelectric elements of the same pair and a current flow between the second contact sides 3b of each of the thermoelectric elements of two neighboring pairs. In other words, the current flows in series across the thermoelectric elements by passing alternately from a P-type thermoelectric element to an N-type thermoelectric element. For this purpose, the module includes a plurality of electrical connection means 20 connecting the first contact sides 3a of the thermoelectric elements of the same pair and to contact sides 3b of each of the thermoelectric elements belonging to two neighboring pairs in order to allow the current flow described above. Two adjacent thermoelectric elements are connected by electrical connection means 20, either via their first contact side 3a or via their second contact side 3b. The assembly 30 according to the invention entails the association of at least one of said thermoelectric elements 4 and one of said electrical connection means 20. Said electrical connection means 20 may also connect said thermoelectric elements in series.

According to the invention, the connection means 20 can be connected to two thermoelectric elements 4 via a single first element 41/second element 42 pair, as shown in FIG. 3, or two first element 41/second element 42 pairs can be used to connect the connection means 20, on the one hand, to a first thermoelectric element and, on the other hand, to a second thermoelectric element.

As shown in FIGS. 4 and 5a to 5c, according to the invention, the assembly 30 includes a first deformable element 41 electrically linking the electrical connection means 20 to the thermoelectric element 4. Said first deformable element 41 includes a first side 51 linked to the electrical connection means 20 and a second side 52 linked to the thermoelectric element 4. Said first side 51 is deformable independently from said second side 52 and vice versa. The assembly furthermore includes a second deformable element 42, forming a heat bridge between the first and second sides 51, 52 of the first deformable element 41.

The electrical connection means 20 may be in contact with a thermal conduction means, not shown, said thermal conduction means being an electrical insulator. The thermal conduction means is made, for example, from ceramic material. It allows the transfer of heat between the cold channel or the hot channel and the electrical connection means 20, which then transmits the heat to the thermoelectric element 4 on which it is located via the first and second deformable elements 41, 42.

The thermal conduction means may be directly in contact with the cold channel or the hot channel. It may also be in a heat exchange relationship with the cold channel or the hot channel via thermal conduction fins to which it is applied.

The electrical connection means 20 includes, notably, electrical paths. They are made, for example, from copper, copper alloy, nickel or nickel alloy. The electrical connection means 20 furthermore includes a soldering material, referred to as solder, including, for example, and aluminum alloy. This solder is disposed, notably, in contact with the electrical paths. It allows the connection means 20 to be soldered to the thermoelectric element 4, notably via the first deformable element 41. In other words, said first deformable element 41 is soldered to said thermoelectric elements 4 and/or to said electrical connection means 20, notably via a plating or brazing sheet, disposed between the first side 51 and the electrical connection means 20 and/or the second side 52 and the thermoelectric element 4.

The first side 51 and the second side 52 are interconnected via two lateral walls 53. The first deformable element 41 thus forms a flat-sided tube, at least said first and second sides 51, 52 being flat.

In the example shown, the first deformable element 41 of the invention is a sheet, notably folded to form the tube. It has a thickness of, for example, between 50 µm and 300 µm. The sheet forming the first element is made notably from metal and, in particular, aluminum or aluminum alloy. A sheet of this type notably has the advantage of being easily locally deformable.

The invention also provides that the first deformable element 41 can be a grid. The structure of the grid improves the local deformation capability of the first deformable element 41.

The second deformable element 42 is, for example, made of graphite. This notably involves a sheet of graphite with a thickness of less than 1 mm.

The second deformable element 42 is located between the first side 51 and the second side of the first deformable element 41, i.e. it is in contact with the first and the second side of the first deformable element 41. It can thus form a heat bridge between the first side 51 and the second side 52 notably in order to conduct heat between the connection means 20 and the thermo-element 4. The second deformable element 42 may also be in contact with the lateral sides 53. Here, the second element 42 fills the entire space 41 delimited by the first side 51, the second side 52 and the lateral sides 53 of the first deformable element 41, i.e. the entire inside of the tube formed by the first deformable element 41.

The second deformable element 42 is plastically and/or elastically deformable. Thus, as shown in FIG. 5, it can follow the deformations of the connection means 20 and of the first side 51 of the first deformable element 41 independently from the deformations of the thermoelectric element 4 and the second side of said first element 41.

These deformations are due, for example, to the expansions and contractions which the connection means 20, the thermoelectric element 4 and the assembly 30 undergo during their soldering and in operation at high temperatures.

Figures 5A, 5B, 5C:
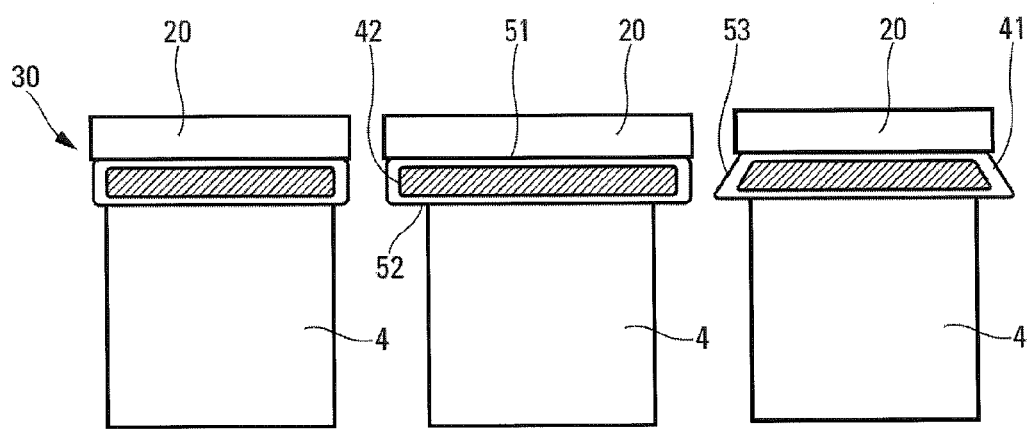
FIGS. 5a, 5b, 5c are side views of the assembly according to the invention shown at ambient temperature before soldering (5a), at soldering temperature (5b) and at ambient temperature after soldering (5c).

FIG. 5a shows the assembly of the invention at ambient temperature before the soldering operation. The connection means 20, the first deformable element 41, the second deformable element 42 and the thermoelectric element 4 have their original dimensions.

In FIG. 5b, the assembly 30 is shown at soldering temperature, during the assembly of the connection means 20 with the first and second deformable elements 41, 42 and the thermoelectric element 4. The connection means 20, the first and second deformable elements 41, 42 and the thermoelectric element 4 have then each undergone a different thermal expansion as a function, notably, of their respective coefficients of thermal expansion. The assembly is then allowed to solidify.

FIG. 5c shows the assembly 30 returned to ambient temperature while the connection means 20 with the first element 41 and the thermoelectric element 4 are soldered together. The connection means 20, the first and second elements 41, 42 and the thermoelectric element 4 have then each undergone a different contraction as a function, notably, of their respective coefficients of thermal expansion.

It is then observed that the first and second deformable elements 41, 42 have been deformed in such a way as to absorb the difference in retraction between the connection means 20 and the thermoelectric element 4. They thus allow the deformations of the connection means 20 to be mechanically decoupled from those of the thermoelectric element 4. The first side 51 of the first deformable element 41 has thus followed the retraction of the connection means 20 and the second side 52 of the first deformable element has followed the retraction of the thermoelectric element 4. The side walls 53 have also been deformed, notably by tilting, to allow the first and second sides 51, 52 to be deformed independently.

During this deformation of the first deformable element 41, the second deformable element 42 has followed this deformation, notably by continuing to occupy the entire inside of the tube defined by the first deformable element 41. It is thus able to provide a good heat conduction between the connection means 20 and the thermoelectric element 4.

The invention claimed is:

1. An assembly comprising:
   at least one thermoelectric element for generating an electric current under the effect of a temperature gradient exerted between two sides of the at least one thermoelectric element, referred to as the contact sides;
   an electrical connection means;
   a first deformable element electrically connecting the electrical connection means to the at least one thermoelectric element, the first deformable element including a first side linked to the electrical connection means and a second side linked to the at least one thermoelectric element,
   the first side being deformable independently from the second side and vice versa;
   a second deformable element forming a heat bridge between the first and second sides of the first deformable element;
   a first soldering material disposed between the first side of the first deformable element and the electrical connection means; and
   a second soldering material disposed between the second side of the first deformable element and the at least one thermoelectric element.

2. The assembly as claimed in claim 1, in which the first deformable element is a grid.

3. The assembly as claimed in claim 2, in which the grid has a thickness of between 50 μm and 300 μm.

4. The assembly as claimed in claim 1, in which the first deformable element is made of metal.

5. The assembly as claimed in claim 1, in which the first and second sides of the first deformable element are interconnected via two lateral sides in such a way that the first deformable element forms a flat-sided tube.

6. The assembly as claimed in claim 5, in which the second deformable element fills a volume delimited by the first side, the second side and the lateral sides of the first deformable element.

7. The assembly as claimed in claim 1, in which the second deformable element is plastically deformable.

8. The assembly as claimed in claim 1, in which the second deformable element is made of graphite.

9. The assembly as claimed in claim 1, in which the first deformable element is soldered to the at least one thermoelectric element and to the electrical connection means by the first soldering material and the second soldering material, respectively.

10. The assembly as claimed in claim 1, including a second thermoelectric element, having two contact sides, the second side of the first deformable element also being linked to the second thermoelectric element.

11. A thermoelectric module including a plurality of assemblies as claimed in claim 1.

12. A thermoelectric device for generating an electric current in a motor vehicle, including at least one module as claimed in claim 11.

* * * * *